(12) United States Patent
Kikuchi et al.

(10) Patent No.: US 6,613,659 B2
(45) Date of Patent: Sep. 2, 2003

(54) MANUFACTURING METHOD OF GATE INSULATING FILM OF MULTIPLE THICKNESS

(75) Inventors: Suichi Kikuchi, Oizumi-machi (JP); Masaaki Momen, Ojiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/215,198

(22) Filed: Aug. 9, 2002

(65) Prior Publication Data
US 2003/0032266 A1 Feb. 13, 2003

(30) Foreign Application Priority Data
Aug. 10, 2001 (JP) ......................... 2001-243726

(51) Int. Cl.$^7$ ................. H01L 21/3205; H01L 21/4763
(52) U.S. Cl. ................. 438/591; 438/217; 438/258; 438/761; 438/763; 438/778
(58) Field of Search ................. 438/217, 218, 438/258, 276, 289, 591, 761, 762, 763, 770, 778, 787

(56) References Cited

U.S. PATENT DOCUMENTS

| | | | | |
|---|---|---|---|---|
| 5,926,729 A | * | 7/1999 | Tsai et al. | 438/591 |
| 6,503,800 B2 | * | 1/2003 | Toda et al. | 438/279 |
| 2001/0031523 A1 | * | 10/2001 | Kimizuka | 438/200 |
| 2003/0032223 A1 | * | 2/2003 | Kikuchi et al. | 438/184 |

\* cited by examiner

*Primary Examiner*—Richard Elms
*Assistant Examiner*—Beth E. Owens
(74) *Attorney, Agent, or Firm*—Morrison & Foerster LLP (57) ABSTRACT

A semiconductor device having a P type well region formed inside a P type semiconductor substrate, on which at least three gate insulating films each having a different thickness are formed. Also, the device has the gate electrode formed extending over the three gate insulating films. The ion implantation of the impurity for controlling the threshold voltage is performed only under the thinnest gate insulating film of the three gate insulating films.

8 Claims, 14 Drawing Sheets

MANUFACTURING METHOD OF GATE INSULATING FILM OF MULTIPLE THICKNESS

BACKGROUND OF THE INVENTION

1. Field of the Invention

This invention relates to a manufacturing method of a gate insulating film, especially to the technology to achieve a high voltage MOS (Metal Oxide Semiconductor) transistor having various kinds of gate insulating films with different thickness.

2. Description of the Related Art

A manufacturing method of a conventional gate insulating film will be explained hereinafter by referring to FIGS. 13A–14B.

In the following explanation, a manufacturing method of a plurality of gate insulating films with different thickness will be described. On a semiconductor substrate, two kinds of gate insulating films are formed, a thick gate insulating film, on which a high voltage MOS transistor is formed, and a thin gate insulating film, on which a normal voltage MOS transistor is formed.

Figure 13A:
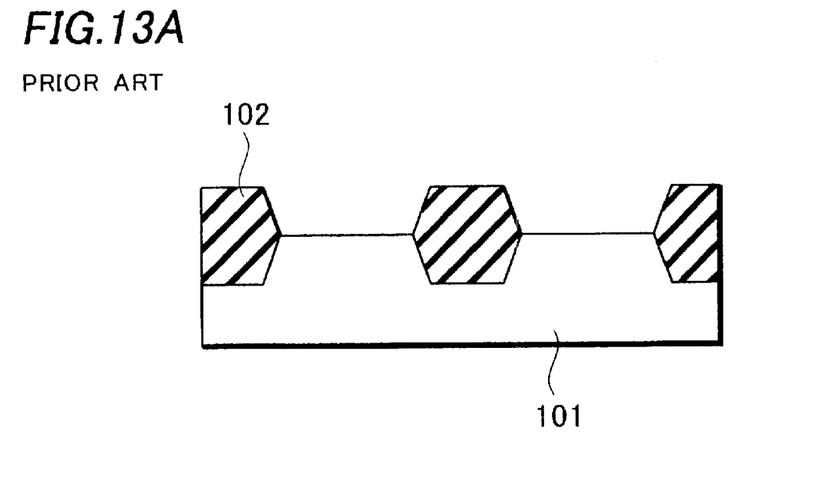
FIGS. 13A–C are a cross-sectional views showing a device intermediate according to a conventional manufacturing method of a gate insulating film.

First, as shown in FIG. 13A, a device isolation film 102 made of a LOCOS film is formed based on the well-known LOCOS (Local Oxidation of Silicon) technology by using an oxide film and a silicon nitride film formed on a semiconductor substrate, for example on a P-type semiconductor substrate 101, as a mask.

Figure 13B:
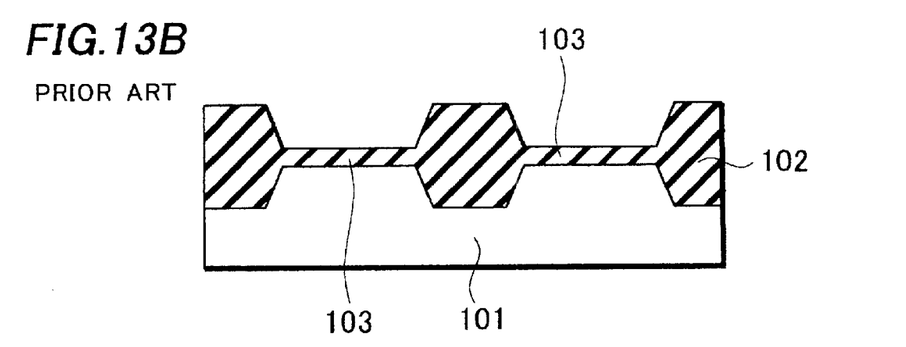

Next, on the substrate 101, a thick gate insulating film 103 is formed through thermal oxidation using the device isolation film 102 as a mask, as shown in FIG. 13B, after removing the oxide film and the silicon nitride film.

Figure 13C:
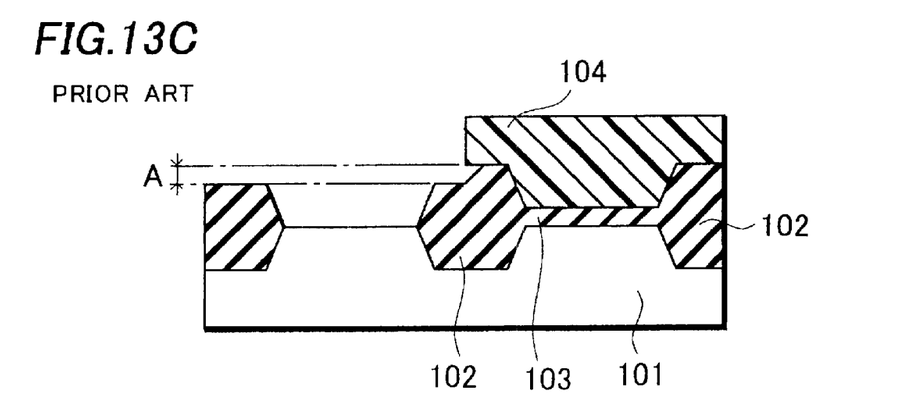

Then, as shown in FIG. 13C, a photoresist film 104 is formed on a part (the region where a high voltage MOS transistor is to be formed) of the thick gate insulting films 103, and the other part (the region where a normal voltage MOS transistor is to be formed) of the thick gate insulating film 103 is removed by using the photoresist film 104 as a mask.

Figure 14A:
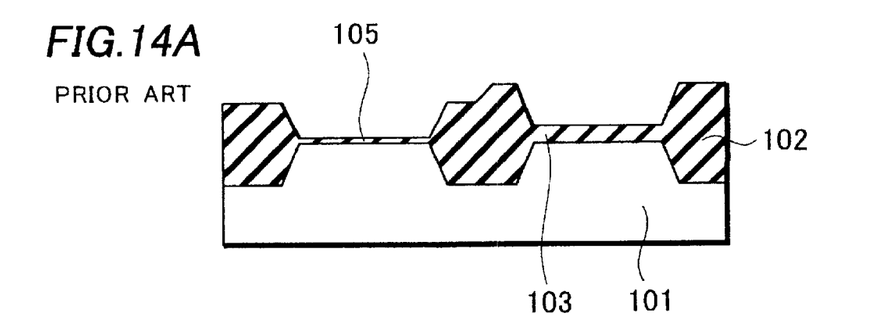
FIGS. 14A and 14B are a cross-sectional views a device intermediate according to the conventional manufacturing method of a gate insulating film, following the step of FIG. 13C.

Furthermore, as shown in FIG. 14A, a thin gate insulating film 105 is formed on the region, where the normal voltage MOS transistor is to be formed, and from which the thick gate insulting film 103 has been removed, through thermal oxidation after the removal of the photoresist film 104.

Figure 14B:
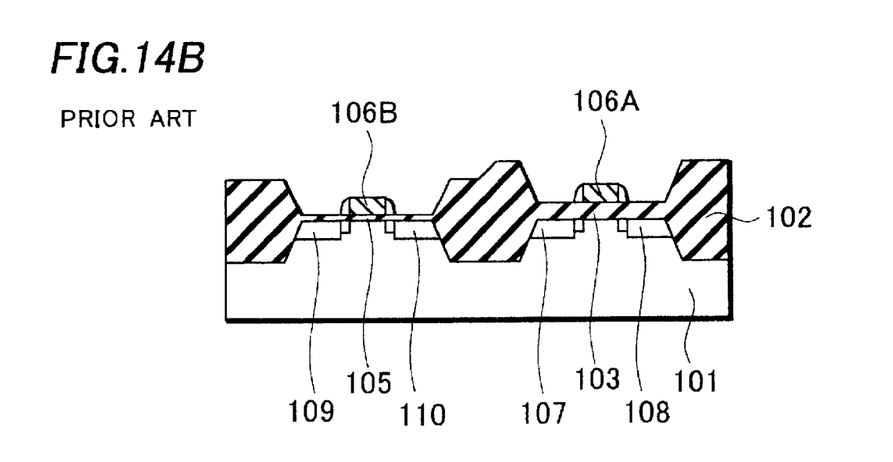

Then, a conductive film for gate electrodes is formed on the thick gate insulating film 103 and the thin gate insulating film 105, as shown in FIG. 14B. Then, gate electrodes 106A and 106B are formed by patterning the conductive film.

N type impurity regions (source and drain regions) 107, 108, 109 and 110 are formed adjacent the gate electrodes 106A and 106B respectively. In a subsequent process step not shown in the drawings, an interlayer insulating film is formed to cover the surface. Then, a metal interconnect, which makes contact with the source and the drain regions 107, 108, 109, 110 through contact holes, is formed. This completes the high voltage MOS transistor on the thick gate insulating film 103 and the normal voltage MOS transistor on the thin gate insulating film 105.

However, during the processes described above, the device isolation film 102 is etched along with the thick gate insulating film 103 (see the width A shown in FIG. 13C), making the device isolation film thinner and, thus, lowering the device isolation ability of the film.

The higher the breakdown strength is required, the thicker the gate insulating film should be. However, when the gate insulating film, which is formed on the entire surface of the normal voltage region, is removed, the device isolation film is also thinned. The more the device isolation film is thinned, the more the device isolation ability of the film is deteriorated.

SUMMARY OF THE INVENTION

Therefore, the manufacturing method of a gate insulating film of this invention is directed to forming the gate insulating films with different thickness on a semiconductor substrate. The manufacturing method includes the process of forming a conductive film on gate insulating films after forming a plurality of the gate insulating films with desirable thickness, and the process of forming a selective oxidation film through selective oxidation of the conductive film using an anti-oxidation film as a mask after forming the anti-oxidation film on predetermined area of the conductive film.

The process of forming a plurality of the gate insulating films includes the process of forming a thick gate insulating film, removing the thick gate insulating film formed on the predetermined area of the conductive film, and forming a thin gate insulating film adjacent the thick gate insulating film.

Furthermore, the manufacturing method of the gate insulating film of this invention includes forming the gate insulating films with different thickness, a first insulating film formed on the semiconductor layer through thermal oxidation method and a second gate insulating film formed through selective oxidation method. The process of forming the first gate insulating film includes forming the thick gate insulting film on the semiconductor layer, removing the thick gate insulating film formed on the predetermined area of the semiconductor layer, and forming a thin gate insulating film adjacent the thick gate insulating film.

Furthermore, the process of forming the second gate insulating film is the same as that of the device isolation film.

DETAILED DESCRIPTION OF THE INVENTION

The manufacturing method of a gate insulating film of this invention will be explained. The embodiment, where this invention is applied to a semiconductor device having various kinds of MOS transistors for configuring a display driver, will be explained by referring to the drawings.

The display device includes various kinds of flat panel display devices such as an LCD (Liquid Crystal Display) display device, an LED (Light Emitting Diode) display device, an organic EL (Electro Luminescence) display device, an inorganic EL display device, a PDP (Plasma Display) device, and a FED (Field Emission Display) device.

Figure 12:
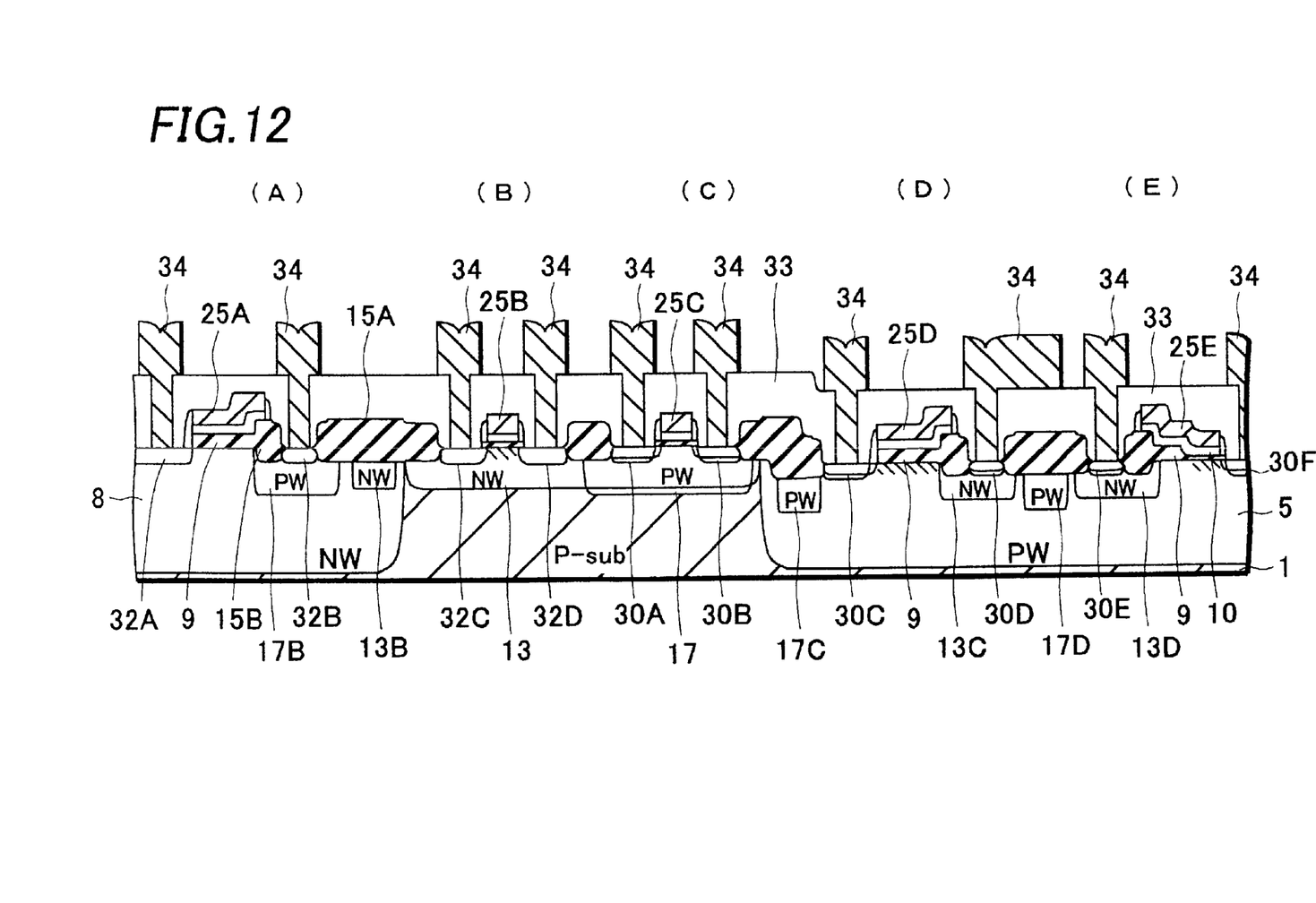
FIG. 12 is a cross-sectional view showing a device intermediate according to the manufacturing method of the gate insulating film of the embodiment, following the step of FIG. 11.

An LCD driver, as an example, will be explained. As shown in FIG. 12, the LCD driver has, from left of the figure, a high voltage (for example, 50V) P channel type MOS transistor (A), a normal voltage (for example, 10V) P channel type MOS transistor (B), a normal voltage (for example, 10V) N channel type MOS transistor (C), a high voltage (for example, 50V) N channel type MOS transistor (D), and an N channel type MOS transistor (E) for a level shifter (for example, 50V).

The manufacturing method of the gate insulating film will be explained hereinafter.

Figure 1:
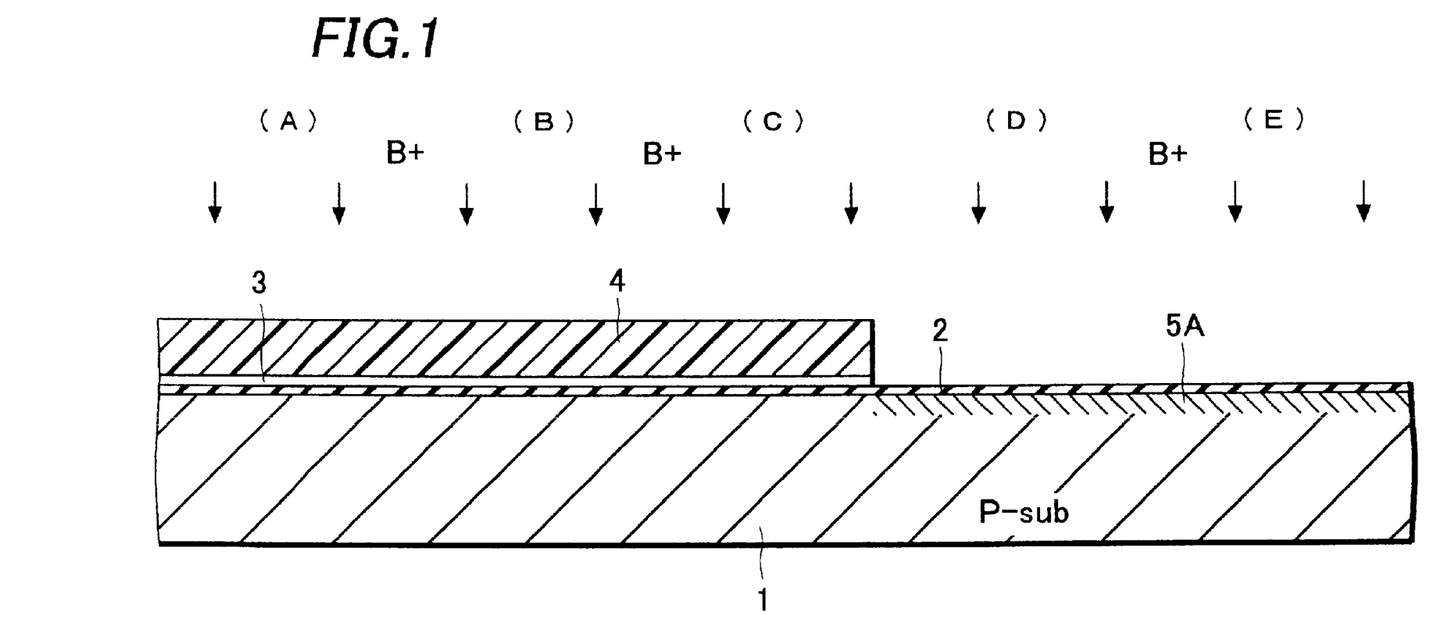
FIG. 1 is a cross-sectional view showing a device intermediate according to a manufacturing method of a gate insulating film of an embodiment of this invention.

First, as shown in FIG. 1, an insulating film 2 (a pad insulating film for forming a LOCOS insulating film described later) with a thickness of 100 nm is formed on a semiconductor (Si) substrate 1 of the first conductivity, for example P type, through thermal oxidation. Then, a silicon nitride film 3 with a thickness of 100 nm is formed on the insulating film 2.

A photoresist film 4 is formed in the region, in which the high voltage P channel type MOS transistor, the normal voltage P channel type MOS transistor, and the normal voltage N channel type transistor are to be formed. The silicon nitride film 3 is removed from the region, in which the high voltage N channel type MOS transistor and the N channel type MOS transistor for the level shifter are to be formed, by using the photoresist film 4 as a mask.

A P type impurities, such as boron ions, are implanted into the location of the substrate for the high voltage N channel type MOS transistor and the N channel type MOS transistor for the level shifter with an implantation condition of 80 KeV acceleration voltage and $1 \times 10^{13}/cm^2$ dose by using the photoresist film 4 and the silicon nitride film 3 as a mask, forming an ion implanted layer 5A for forming a P type well region.

Figure 2:
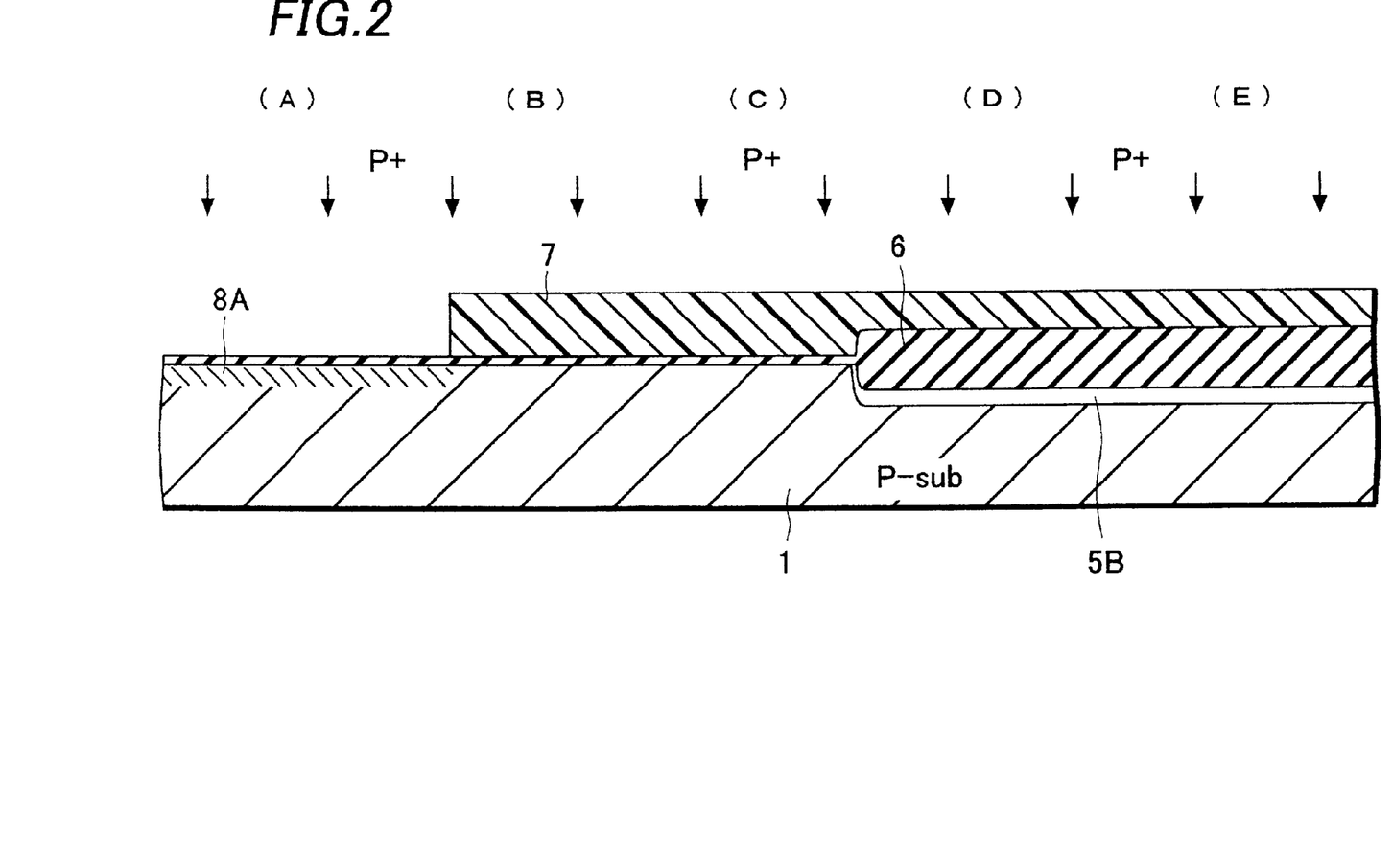
FIG. 2 is a cross-sectional view showing a device intermediate according to the manufacturing method of the gate insulating film of the embodiment, following the step of FIG. 1.

Next, as shown in FIG. 2, a LOCOS insulating film 6 with a thickness of 800 nm is formed on the region, in which the high voltage N channel type MOS transistor and the N channel type MOS transistor for the level shifter are to be formed, through the selective oxidation of the silicon nitride film 3 (in $O_2$ atmosphere at about 1000° C. for one hour) using the silicon nitride film 3 as a mask, after removing the photoresist film 4. Also, an impurity layer 5B is formed because the ion implanted layer 5A under the LOCOS insulating film 6 is diffused (the impurity layer 5B will become a P type well region 5 after a diffusion process later described in FIG. 3).

Then, a photoresist film 7 is formed on the region, in which the normal voltage P channel type MOS transistor, the normal voltage N channel type MOS transistor, the high voltage N channel type MOS transistor, and the high voltage N channel type MOS transistor for the level shifter are to be formed. Then, an N type impurities, such as phosphorus ions, are implanted with an implantation condition of 160 KeV acceleration voltage and $4 \times 10^{12}/cm^2$ dose by using the photoresist film 7 as a mask, forming an ion implanted layer 8A for forming an N type well region under the region for the high voltage P channel type MOS transistor.

Figure 3:
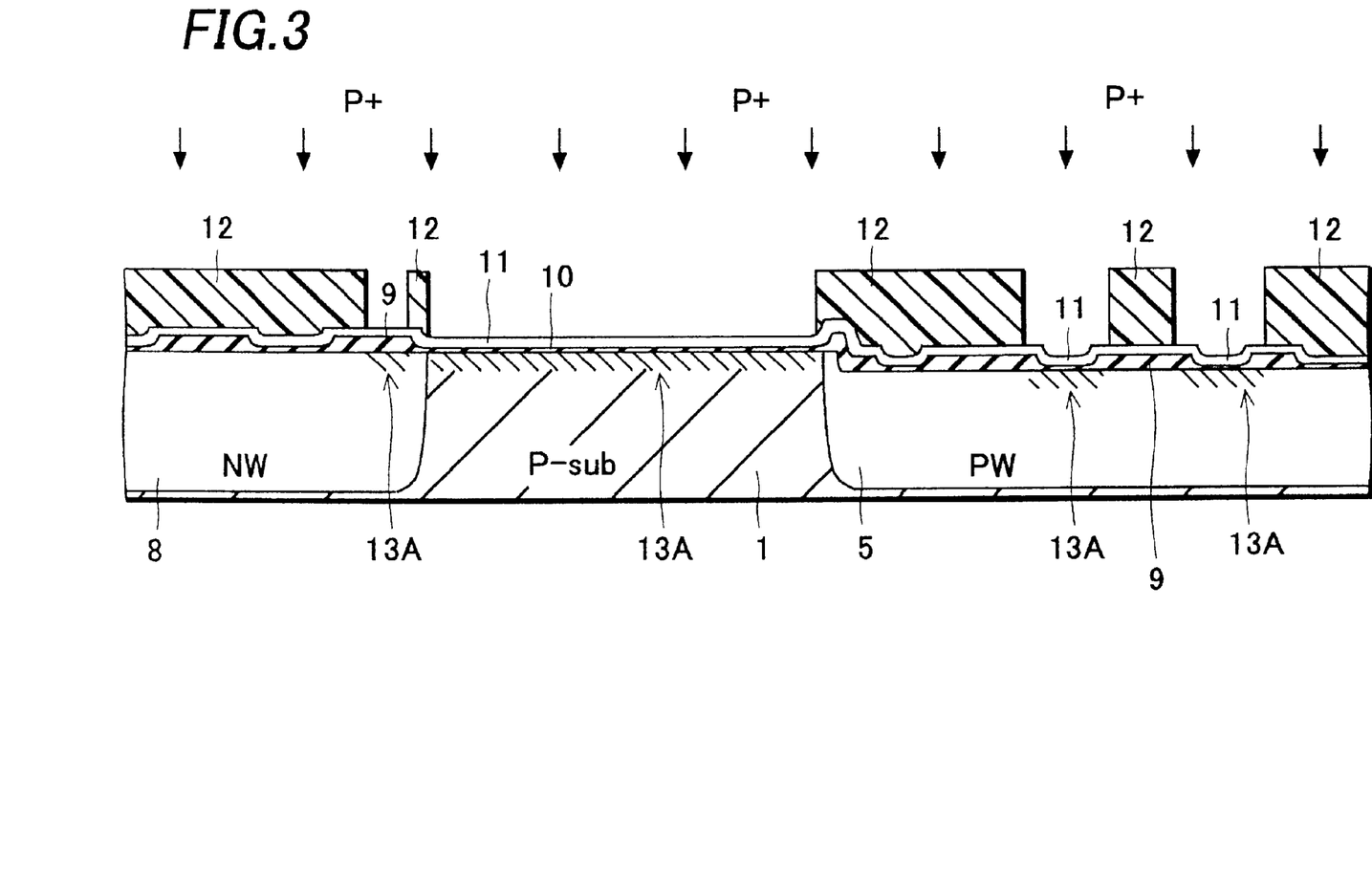
FIG. 3 is a cross-sectional view showing a device intermediate according to the manufacturing method of the gate insulating film of the embodiment, following the step of FIG. 2.

Next, the photoresist film 7 and the LOCOS insulating film 6 are removed. The P type well region 5 and the N type well region 8 are formed through a diffusion process (in a $N_2$ atmosphere at about 1200° C. for 8 hours) performed on the ion implanted layer 5A and the ion implanted layer 8A respectively, as shown in FIG. 3.

A thick gate insulating film 9 (a portion of a first gate insulating film) with a thickness of 120 nm is formed on the entire surface of the substrate through pyrolytic oxidation at 875° C. A photoresist film (not shown in the figure) is formed on the gate insulating film 9 in a part of the region where the high voltage P channel type MOS transistor, the high voltage N channel type MOS transistor, and the N channel type MOS transistor for the level shifter are to be formed. The gate insulating film 9 is removed from the region not covered with the photoresist film.

After the removal of the photoresist film, a thin gate insulating film 10 (a part of the first gate insulating film) with a thickness of about 15 nm is formed by a pyrolytic oxidation of the entire surface of the substrate at about 850° C. followed by a thermal processing in $N_2$ atmosphere at 900° C. for 10 minutes. Also, the thickness of the gate insulating film 9 somewhat increases during this process because of the oxidation of the substrate surface under the gate insulating film 9.

Then, a polysilicon film 11 (a pad polysilicon film for forming a LOCOS insulating film described later) with 50 nm in thickness is formed on the entire surface of the substrate. An N type impurities, such as phosphorus ions, are implanted with an implantation condition of 140 KeV and $7 \times 10^{12}/cm^2$ dose by using a photoresist film 12 formed on the polysilicon film 11 as a mask. As shown in FIG. 3, an ion implanted layer 13A is formed at a device isolation film 15A (see FIG. 4), which is to be formed between the high voltage P channel type MOS transistor and the normal voltage P channel type MOS transistor, at the region, where the normal voltage P channel type MOS transistor and the normal voltage N channel type MOS transistor, and at the region, where the drain of the high voltage N channel type MOS transistor and the drain of the N channel type transistor for the level shifter are to be formed.

Figure 4:
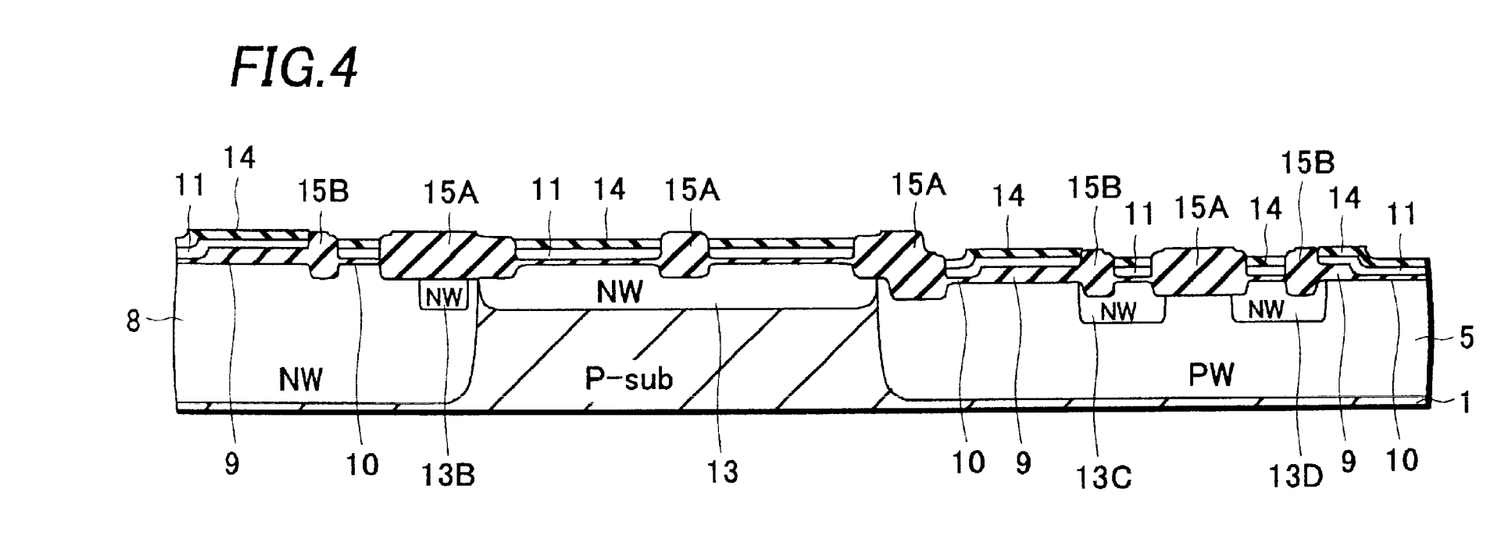
FIG. 4 is a cross-sectional view showing a device intermediate according to the manufacturing method of the gate insulating film of the embodiment, following the step of FIG. 3.

Then, as shown in FIG. 4, the device isolation film 15A made of a LOCOS insulating film and a second gate insulating film 15B also made of a LOCOS insulating film are formed through selective oxidation on the substrate by using a silicon nitride film 14 formed on the polysilicon film 11 as a mask. The ion implanted layer 13A is diffused through selective oxidation, forming an N type channel stopper layer 13B under the device isolation film 15A between the high voltage P channel type MOS transistor and the normal voltage P channel type MOS transistor. An N type well region (NW) 13 is formed at the region, where the normal voltage P channel type MOS transistor and the normal voltage N channel type MOS transistor are to be formed. A drain region 13C is formed in the region of the high voltage N channel type MOS transistor to include the lower portion of the second gate insulating film 15B and a drain region 13D is formed in the region of the N channel type MOS transistor for the level shifter to include the lower portion of the second gate insulating film 15B. The N type channel stopper layer 13B, the drain region 13C and the drain region 13D, which are formed through the same processes as those for forming the N type well region (NW), are indicated as NW in the figure for the sake of convenience.

The thick gate insulating film 9 (a part of the first gate insulating film) is first formed in this embodiment, as described earlier. Then the thin gate insulating film 10 (a part of the first insulating film) is formed after removing a part of the thick gate insulating film 9. Furthermore, the second gate insulating film 15B made of the LOCOS insulating film is formed so as to be adjacent the thick gate insulating film 9. In the conventional manufacturing method, the device isolation film is thinned because various kinds of the gate insulating films 103, 105 are formed after forming the device isolation film 102. However, the device isolation ability of the device isolation film 15A formed in the same way as that of the second gate insulating film 15B is not deteriorated in this invention.

Figure 5:
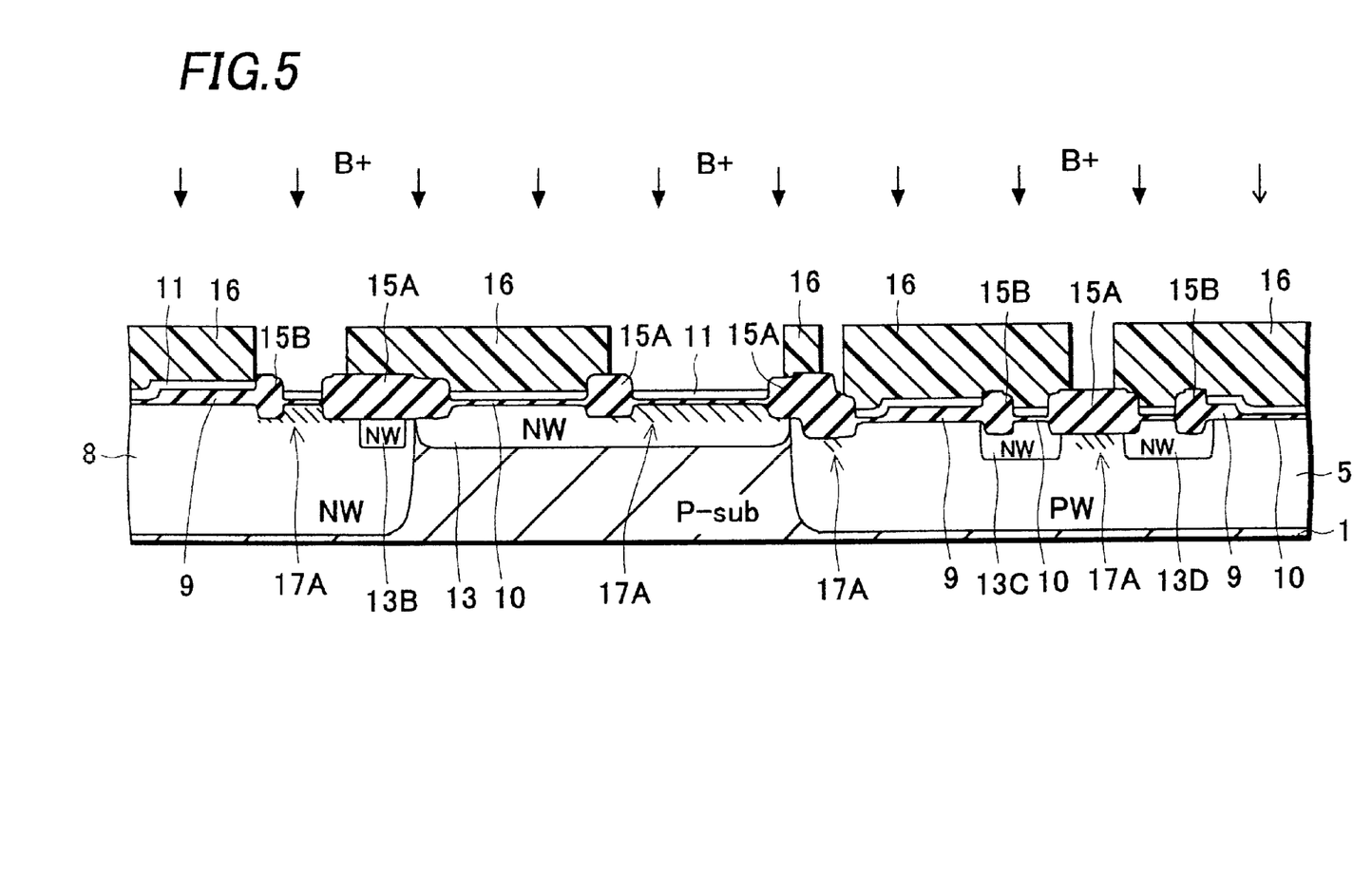
FIG. 5 is a cross-sectional view showing a device intermediate according to the manufacturing method of the gate insulating film of the embodiment, following the step of FIG. 4.

Next, a photoresist film 16 is formed, as shown in FIG. 5, on a part of the region where the high voltage P channel type MOS transistor to be formed, on the region where the normal voltage P channel type MOS transistor to be formed, on a part of the device isolation film 15A formed between the regions where the normal voltage N channel type MOS transistor and the high voltage N channel type MOS transistor to be formed, on the region where the high voltage N channel type MOS transistor to be formed, on a part of the device isolation film 15A formed between the regions where the high voltage N channel type MOS transistor and the N channel type MOS transistor for the level shifter to be formed, and on the region where the N channel type MOS transistor for the level shifter to be formed. A P type impurity such as boron ion is implanted with an implantation condition of 160 KeV and $1.45 \times 10^{13}/cm^2$ dose by using the photoresist film 16 as a mask to form an ion implanted layer 17A in each region.

Figure 6:
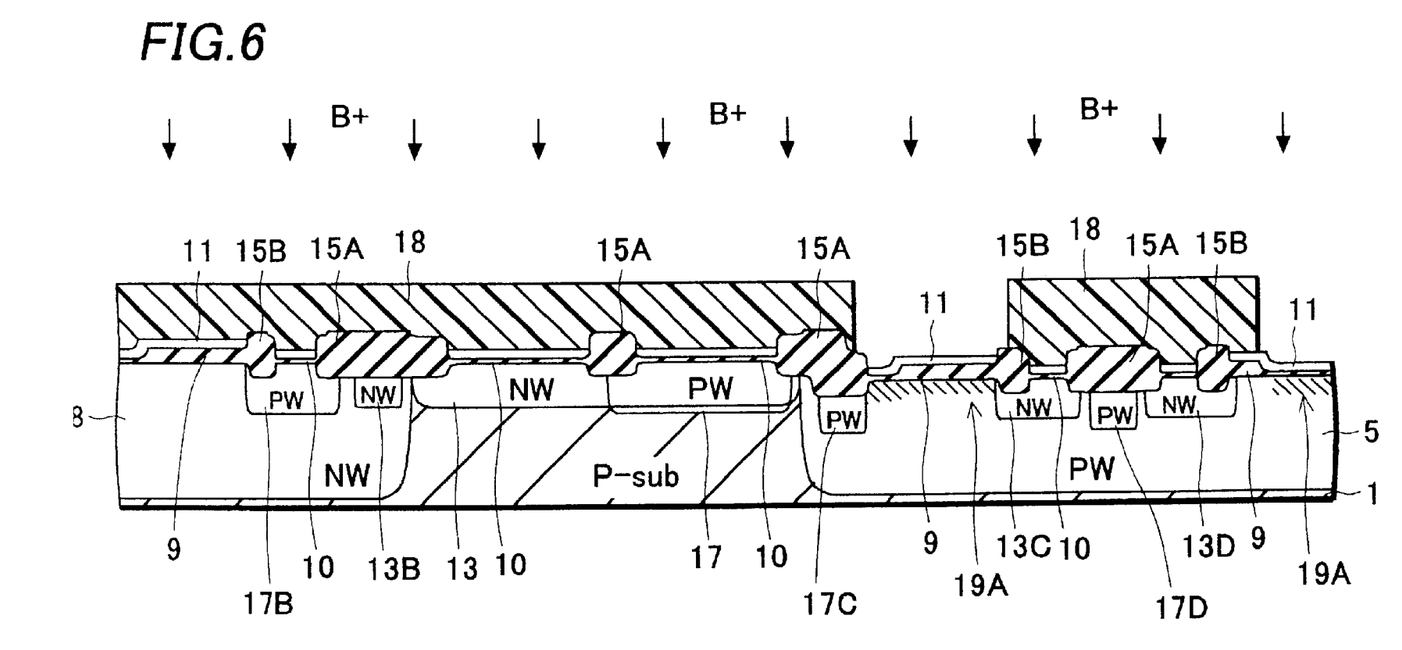
FIG. 6 is a cross-sectional view showing a device intermediate according to the manufacturing method of the gate insulating film of the embodiment, following the step of FIG. 5.

After removing the photoresist film 16, a diffusion process (in a $N_2$ atmosphere at about 1100° C. for 3 hours) is performed on the ion implanted layer 17A, as shown in FIG. 6, to form a drain region 17B of the high voltage P channel type MOS transistor, a P type well region (PW) 17 of the normal voltage N channel type MOS transistor, a P type channel stopper layer 17C under the device isolation film 15A between the regions where the normal voltage N channel type MOS transistor and the high voltage N channel type MOS transistor to be formed, and a P type channel stopper layer 17D under the device isolation film 15A between the regions where the high voltage N channel type MOS transistor and the N channel type MOS transistor for the level shifter are to be formed. Also, the drain region 17B, the P type channel stopper layer 17C, and the P type channel stopper layer 17D, which are formed through the same processes as those for forming the P type well region (PW), are indicated as PWs in the figure for the sake of convenience.

A photoresist film 18 is then formed on the regions, where the high voltage P channel type MOS transistor, the normal voltage P channel type MOS transistor, the normal voltage N channel type MOS transistor, the drain region 13C of the high voltage N channel type MOS transistor, and the drain region 13D of the N channel type MOS transistor for the level shifter are to be formed.

An ion implanted layer 19A is formed through the ion implantation of a P type impurities, such as boron ions, for controlling the threshold voltage by using the photoresist film 18 as a mask under the thick gate insulating film 9 and the thin gate insulating film 10 of the high voltage N channel type MOS transistor and under the thin gate insulating film 10 of the N channel type MOS transistor for the level shifter. In this process, a first ion implantation is performed with a condition of 35 KeV and $1 \times 10^{12}/cm^2$ dose for controlling the threshold voltage of the N channel type MOS transistor for the level shifter and then a second ion implantation is performed with a condition of 160 KeV and $1 \times 10^{12}/cm^2$ dose for controlling the threshold voltage of the high voltage N channel type MOS transistor. Also, the order for performing the first and second ion implantations can be reversed.

In this embodiment, the process, in which the ion implantation for controlling the threshold voltage of the high voltage N channel type MOS transistor is performed together with the ion implantation for controlling the threshold voltage of the N channel type MOS transistor for the level shifter, is adopted. However, these two implantations can be done separately.

Figure 7:
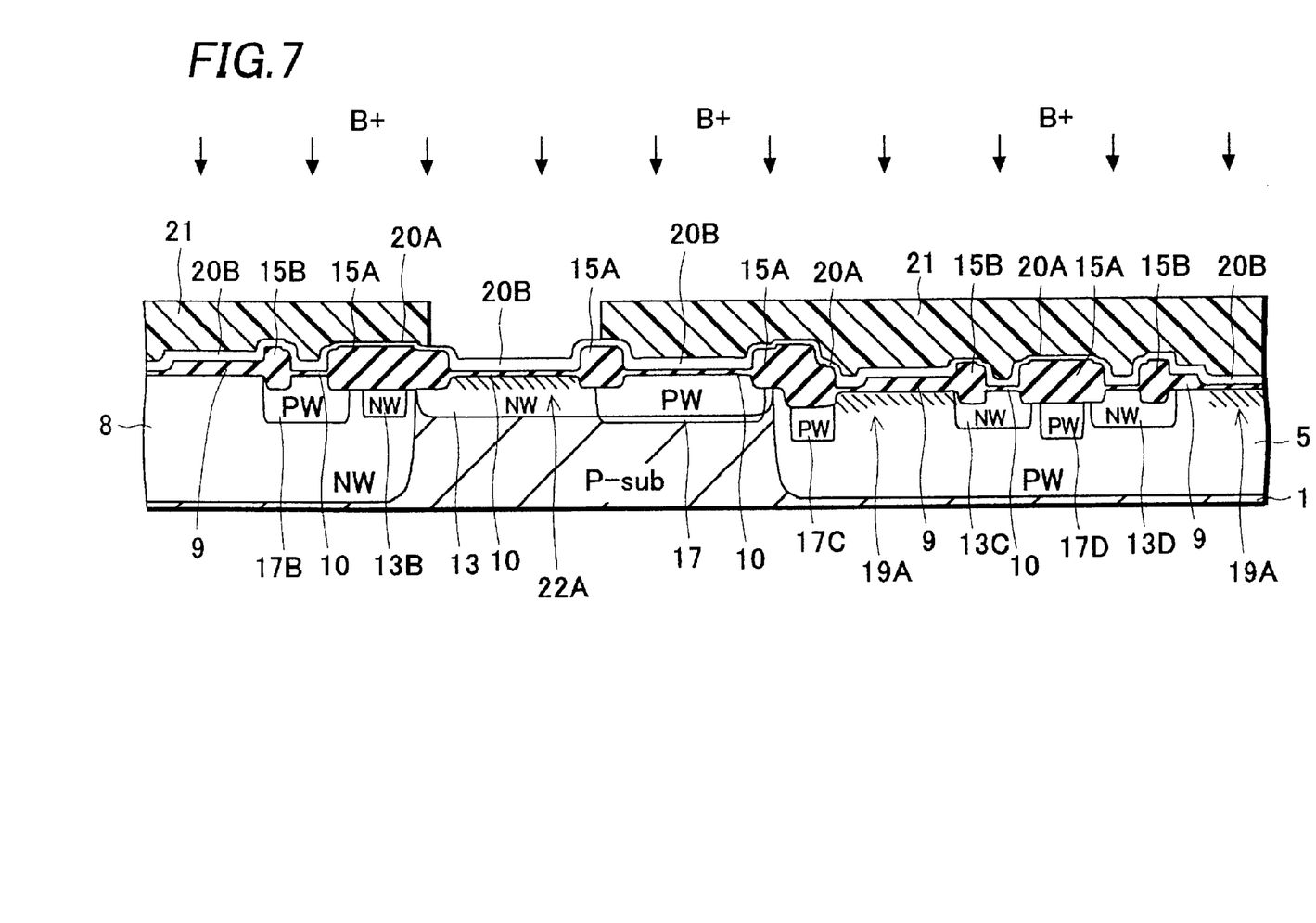
FIG. 7 is a cross-sectional view showing a device intermediate according to the manufacturing method of the gate insulating film of the embodiment, following the step of FIG. 6.

Then, as shown in FIG. 7, a polysilicon film with a thickness of 50 nm is formed on the entire surface of the substrate after removing the photoresist film 18. The thickness of the polysilicon film is different between the region where the polysilicon layer 11 has been consumed during the selective oxidation process (see FIG. 4) described above, and the region where the polysilicon film 11 has not been consumed. That is, a thin polysilicon film 20A is formed above the device isolation film 15A and the second gate insulating film 15B and a thick polysilicon film 20B is formed on other regions. Also, this thick polysilicon film 20B is to be used as a part of each of gate electrodes 25A, 25B, 25C, 25D, and 25E (see FIG. 8). Furthermore, the polysilicon film is newly put on the polysilicon film 11, which has been used for forming the LOCOS insulating film, in order to obtain the polysilicon film 20B with a desirable thickness, in this embodiment. However, it is also possible to omit the process for newly putting the polysilicon film by adjusting the thickness of the polysilicon film 11.

Additionally, the polysilicon film, which has been used for forming the LOCOS insulating film, remains in this embodiment. Therefore, the number of the manufacturing processes can be reduced in this embodiment, compared to the case where a polysilicon film for forming the gate electrode is newly formed after removing the polysilicon film for the LOCOS insulating film. However, this invention does not exclude the manufacturing process, where a polysilicon film for forming the gate electrode is newly formed after removing the polysilicon film used for forming the LOCOS insulating film.

Next, a photoresist film 21 is formed on the regions, where the high voltage P channel type MOS transistor, the normal voltage N channel type MOS transistor, the high voltage N channel type MOS transistor, and the N channel MOS transistor for the level shifter are to be formed.

Then, a P type impurities, such as boron ions, for controlling the threshold voltage of the normal voltage P channel type MOS transistor are implanted with the condition of 40 KeV and $2.25 \times 10^{12}/cm^2$ dose by using the photoresist film 21 as a mask, forming an ion implanted layer 22A.

Figure 8:
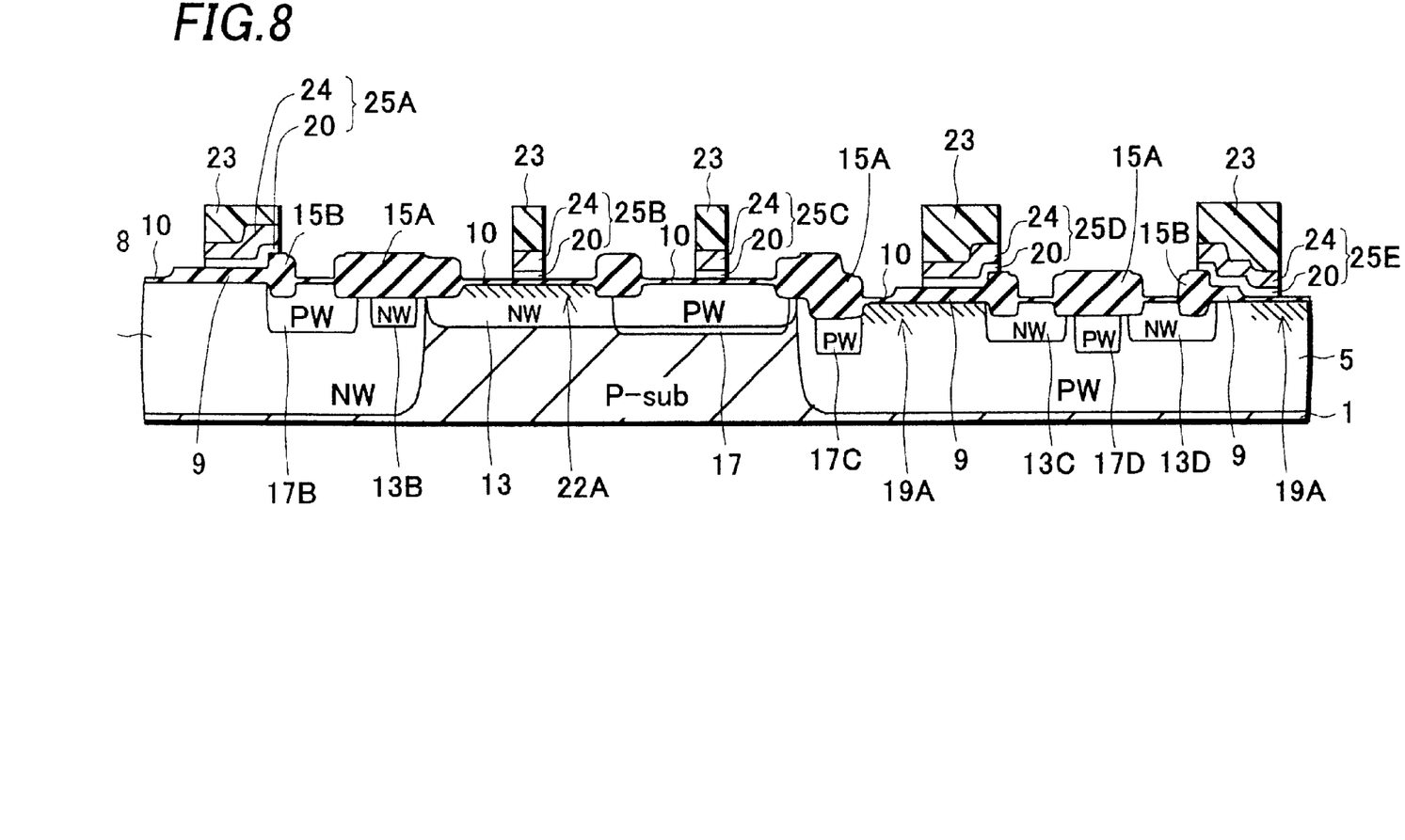
FIG. 8 is a cross-sectional view showing a device intermediate according to the manufacturing method of the gate insulating film of the embodiment, following the step of FIG. 7.

The phosphorus doping is performed to the polysilicon films 20A and 20B with $POCl_3$ as the thermal diffusion source after removing the photoresist film 21. Then, a silicide film (tungsten silicide, WSix, film in this embodiment) is formed on the polysilicon films 20A and 20B. Gate electrodes 25A, 25B, 25C, 25D, and 25E, having the tungsten silicide film 24 disposed on the polysilicon film 20, are formed through the patterning of the tungsten silicide film and the polysilicon film by using the photoresist film 23 as a mask, as shown in FIG. 8. However, the types of conductive film for forming the gate electrodes 25A, 25B, 25C, 25D, and 25D are not limited to the configuration described above. For example, a single layer structure made only from the polysilicon film can be employed.

Figure 9:
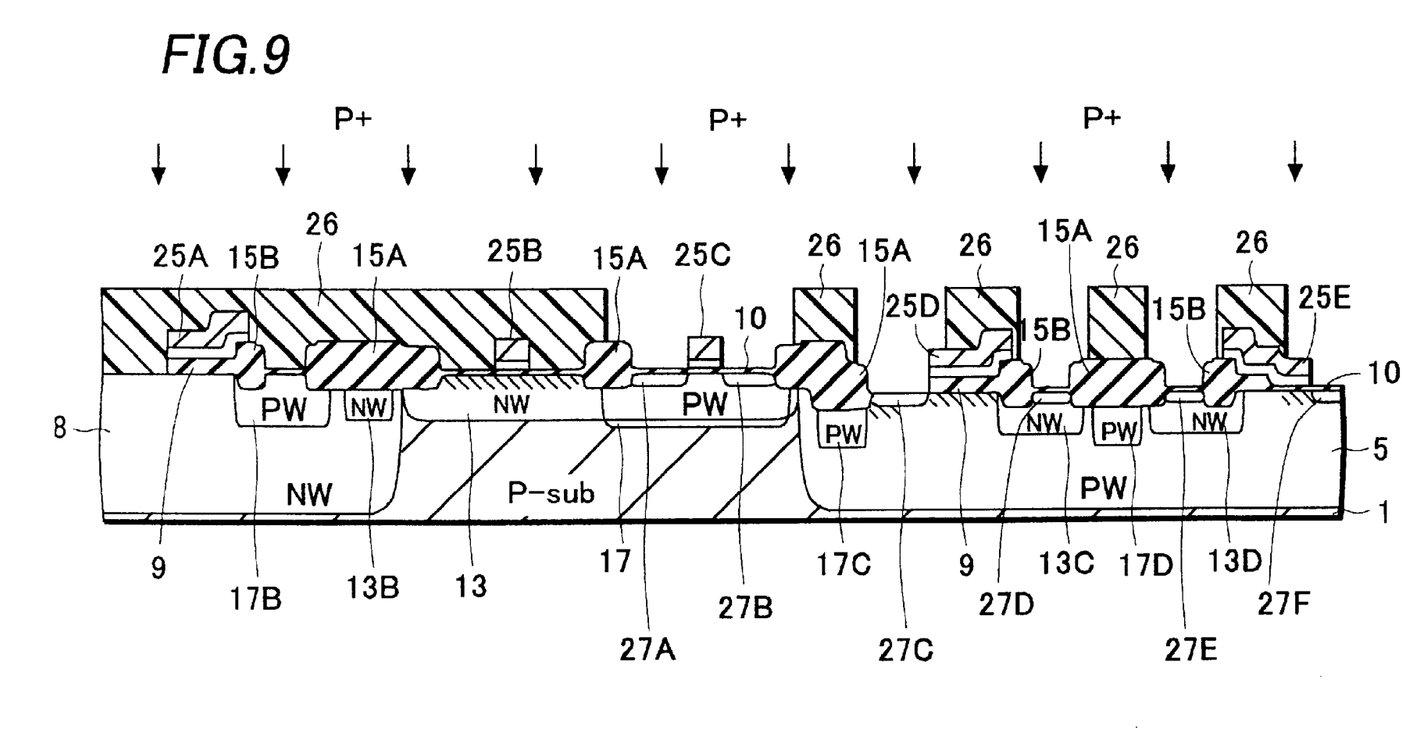
FIG. 9 is a cross-sectional view showing a device intermediate according to the manufacturing method of the gate insulating film of the embodiment, following the step of FIG. 8.

Next, the gate insulating films 9 and 10 at the source region side of the high voltage P channel type MOS transistor and the gate insulating films 9 and 10 at the source region side of the high voltage N channel type MOS transistor are removed through etching by using a photoresist film (not shown in the figure) as a mask (see FIG. 9).

Also as shown in FIG. 9, a photoresist film 26 is formed and an ion implantation for forming low concentration N- type source and drain of each of the N channel type MOS transistors is performed by using a photoresist film 26 as a mask. That is, an N type impurities, such as phosphorus ions, are implanted with a condition of 60 KeV acceleration voltage and $7.5 \times 10^{12}/cm^2$ dose with the photoresist film 26, the gate electrodes 25C, 25D, 25E, the device isolation film 15A, and the second gate insulating film 15B being used as a mask, forming low concentration source and drain regions 27A and 27B adjacent the gate electrode 25C through the gate insulating film 10, low concentration source and drain regions 27C and 27D adjacent the gate electrode 25D through the gate insulating films 9 and 15B, and low concentration source and drain regions 27E and 27F adjacent the gate electrode 25E through the gate insulating films 10 and 15B.

Figure 10:
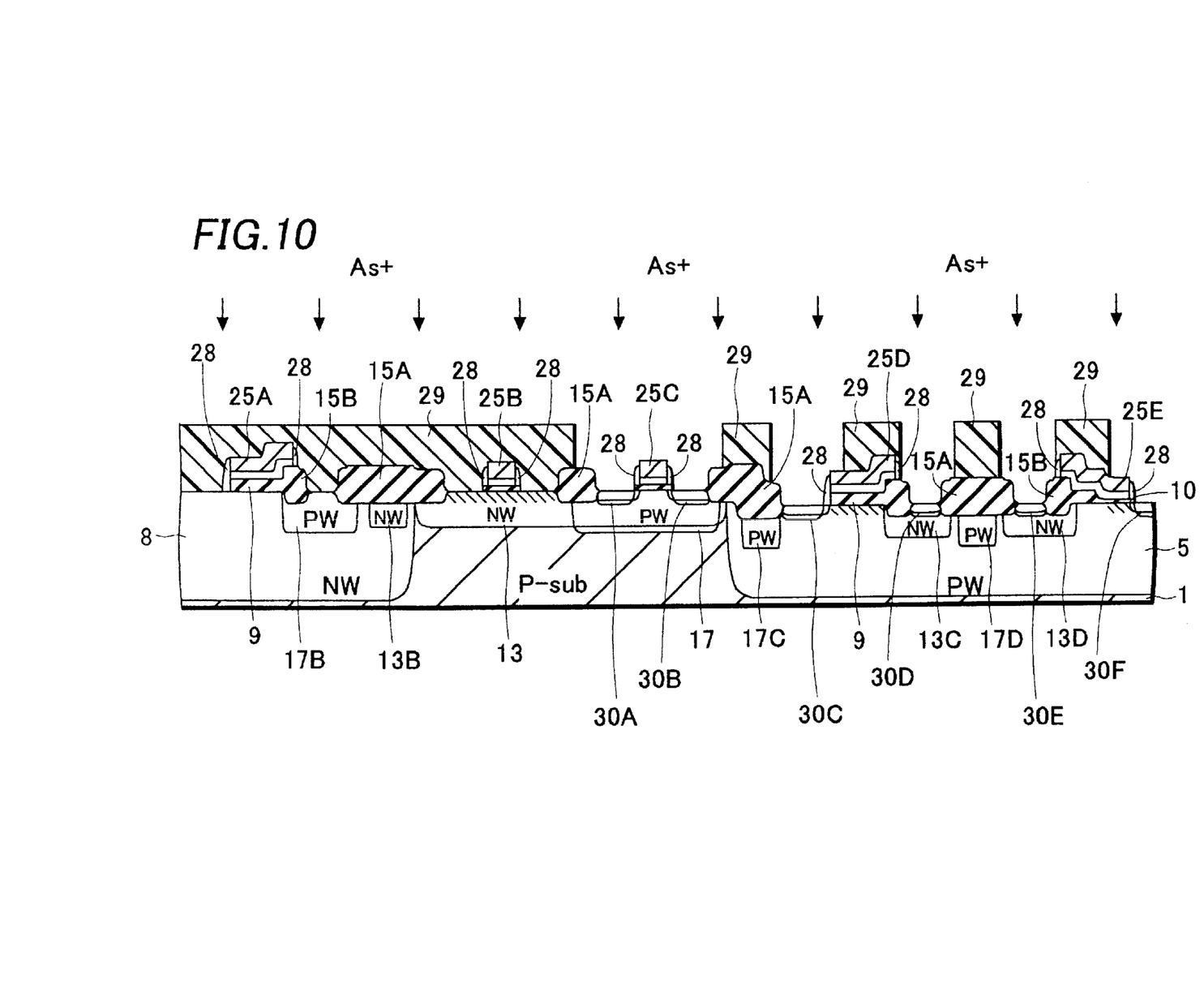
FIG. 10 is a cross-sectional view showing a device intermediate according to the manufacturing method of the gate insulating film of the embodiment, following the step of FIG. 9.

Then, a sidewall spacer film 28 is formed at the sidewall of each of the gate electrodes 25A. 25B, 25C, 25D, and 25E, as shown in FIG. 10, by performing anisotropic etching on a insulating film, which has been formed on the entire surface through the CVD method with a thickness of 300 nm.

Furthermore, a photoresist film 29 is formed, and then, an ion implantation for forming high concentration N+ type source and drain of each of the N channel type MOS transistors is performed by using a photoresist film 29 as a mask. That is, an N type impurities, such as arsenic ions, are implanted with a condition of 70 KeV acceleration voltage and $5 \times 10^{15}/cm^2$ dose with the photoresist film 29, the gate electrodes 25C, 25D, 25E, the device isolation film 15A, the gate insulating film 15B and the sidewall spacer film 28 being used as a mask, forming high concentration source and drain regions 30A and 30B adjacent the gate electrode 25C through the sidewall spacer film 28, high concentration source and drain regions 30C and 30D adjacent the gate electrode 25D through the sidewall spacer film 9 and the gate insulating film 15B, and high concentration source and drain regions 30E and 30F adjacent the gate electrode 25E through the sidewall spacer film 28 and the gate insulating film 15B.

Figure 11:
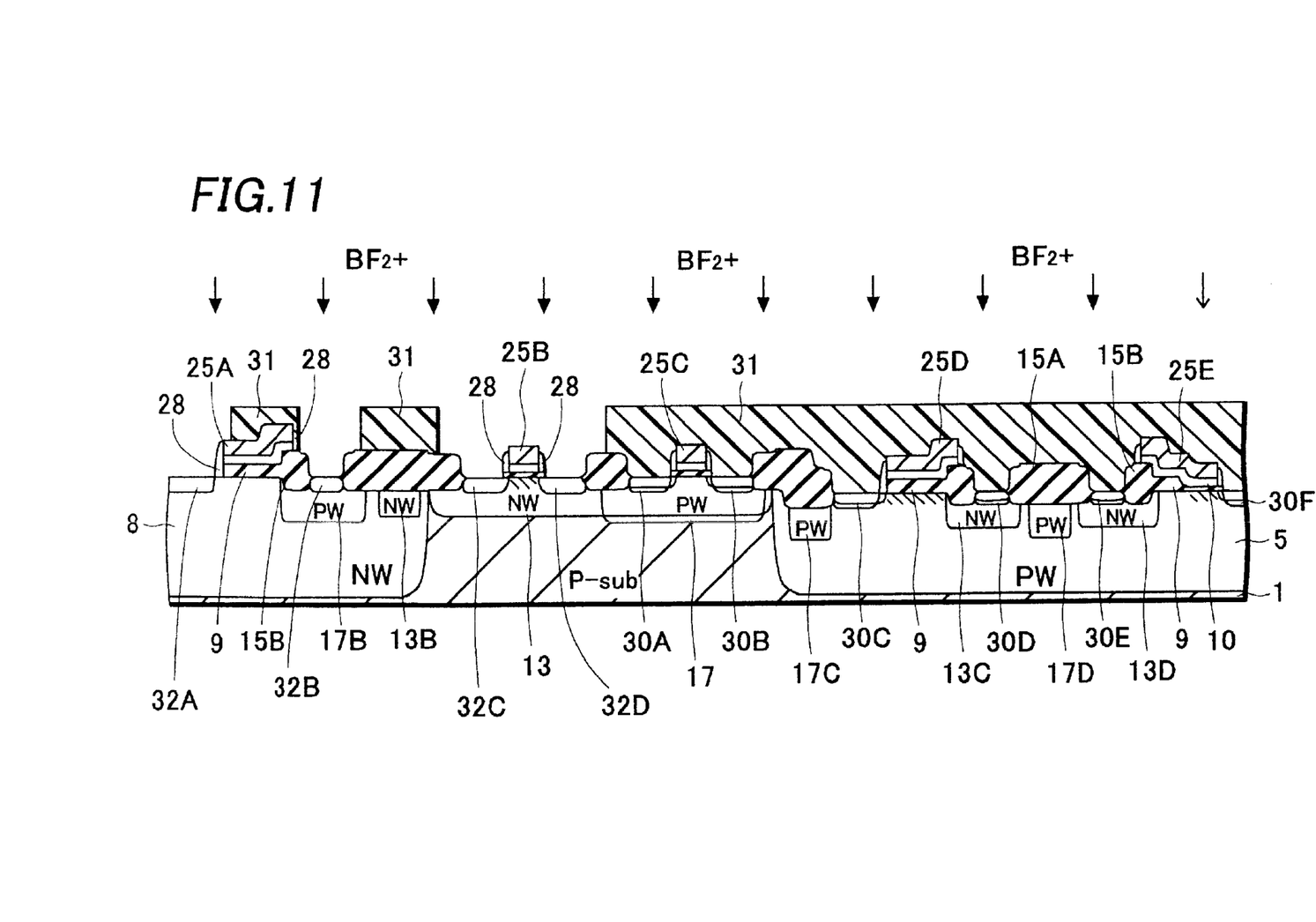
FIG. 11 is a cross-sectional view showing a device intermediate according to the manufacturing method of the gate insulating film of the embodiment, following the step of FIG. 10.

Then, a photoresist film 31 is formed and an ion implantation for forming P type source and drain of each of the P channel type MOS transistors is performed by using a photoresist film 31 as a mask. That is, a P type impurities, such as boron difluoride ions, are implanted with a condition of 40 KeV acceleration voltage and $3 \times 10^{15}/cm^2$ dose with the photoresist film 31, the gate electrodes 25A, 25B, the device isolation film 15A, the gate insulating film 15B, and the sidewall spacer film 28 being used as a mask, forming source and drain regions 32A and 32B adjacent the gate electrode 25A through the sidewall spacer film 28 and the gate insulating film 15B, and source and drain regions 32C and 32D adjacent the gate electrode 25B through the sidewall spacer film 28.

Next, an interlayer insulating film 33 made of NSG (Non-doped Silicate Glass) or BPSG (Boro-Phospho Silicate Glass) is formed, as shown in FIG. 12. Then, a metal interconnect 34 (for example, Al film, Al—Si film, Al—Si—Cu film), which makes contact with each of the source and drain regions 32A, 32B, 32C, 32D, 30A, 30B, 30C, 30D, 30E, and 30F through contact holes made in the interlayer insulating film 33, is formed. This completes various kinds of transistors providing the LCD driver.

Then, a passivation film (not shown in the figure) is formed on the entire surface, which completes the semiconductor device of this invention.

As described above, in the semiconductor device of this invention, the gate insulating film providing the LOCOS offset structure has a three-layer structure (E in FIG. 12), the thick gate insulating film 9, the thin gate insulating film 10 formed by thermal oxidation, and the LOCOS insulating film 15B formed by selective oxidation, respectively, leading to relieving the concentration of the electric field to a degree which is not accomplished by the conventional LOCOS offset structure, in which a gate electrode is formed on a gate insulating film having a constant thickness and formed by thermal oxidation, and on the LOCOS insulating film adjacent the gate insulating film formed by selective oxidation.

In this embodiment, as described above, the ion implantation for threshold control is made only to the portion under the thin gate insulation film 10 and not to a portion under the thick gate insulation film 9. Therefore, the impurity concentration under the thick gate insulation film 9 remains low. Because of this low impurity concentration under the thick gate insulation film 9, the maximum drain voltage applicable to the device can be significantly higher than that of the conventional structure. Furthermore, the thick gate insulation film 9 can withstand a high voltage applied at the drain electrode and, thus, further contributes to a higher maximum voltage applicable to the device.

The channel layer region under the thin gate insulating film 10 has a low threshold voltage because of the thinner insulation film and, thus, provides a large driving capacity of the device. The level of the threshold voltage is adjusted by the implantation of P-type impurities.

Furthermore, this invention is applied to the N channel type MOS transistor for the level shifter in this embodiment, but this invention is also applicable to a level shifter comprising the P channel type MOS transistor and any high voltage MOS transistor requiring a high breakdown strength of the drain. Especially, it is applicable to the manufacturing processes of gate insulating film with different thickness having both the normal voltage MOS transistor and the high voltage MOS transistor.

Also, the gate insulating film having a plurality of thicknesses can be formed without reducing the thickness of the LOCOS insulating film by repeating the processes of forming the thick gate insulating film by thermal oxidation and, then, forming the thin gate insulating film by thermal oxidation after the removal of the thick gate insulating film, before the formation of the LOCOS insulating film.

According to this invention, the gate insulating film with different thicknesses can be easily formed without reducing the thickness of the LOCOS insulating film, preventing the deterioration of the ability of the device isolation film.

What is claimed is:

1. A method of forming a gate insulating film of multiple thickness on a semiconductor layer, comprising:

forming a plurality of gate insulating films each having a different thickness on the semiconductor layer;

forming a conductive film on the plurality of gate insulating films;

forming an anti-oxidation film on a predetermined area of the conductive film; and forming a selective oxidation film by selectively oxidizing the conductive film using the anti-oxidation film as a mask.

2. The method of forming a gate insulating film of claim 1, wherein the forming of the selective oxidation film includes selectively oxidizing the semiconductor layer using the anti-oxidation film as a mask.

3. The method of forming a gate insulating film of claim 1, wherein the plurality of gate insulating films and the selective oxidation film are a part of the gate insulating film of a multiple thickness.

4. The method of forming a gate insulating film of claim 1, wherein the forming of the plurality of gate insulating films comprises forming a thick gate insulating film, removing a part of the thick gate insulating film, and forming a thin gate insulating film adjacent the thick gate insulating film.

5. A manufacturing method of a gate insulating film including a first gate insulating film formed by thermal oxidation on a semiconductor layer and a second gate insulating film formed by selective oxidation on the semiconductor layer, comprising:

forming a thick gate insulating film on the semiconductor layer;

removing a part of the thick gate insulating film formed at a predetermined portion of the semiconductor layer; and forming a thin gate insulating film adjacent the thick gate insulating film, wherein the thick gate insulating film and the thin gate insulating film are a part of the first gate insulating film.

6. The manufacturing method of a gate insulating film of claim 5, further comprising:

forming a conductive film on the thick gate insulating film and the thin gate insulating film;

forming an anti-oxidation film on a predetermined area of the conductive film; and forming the second gate insulating film by selectively oxidizing the conductive film using the anti-oxidation film as a mask.

7. The manufacturing method of a gate insulating film of claim 5, wherein the forming of the second gate insulating film includes selectively oxidizing the semiconductor layer using the anti-oxidation film as a mask.

8. The manufacturing method of the gate insulating film of claim 5, further comprising forming a device isolation film by the same selective oxidation of the conductive film as the forming of the second gate insulating film.

* * * * *